(12) United States Patent
Jung

(10) Patent No.: US 8,841,623 B2
(45) Date of Patent: Sep. 23, 2014

(54) X-RAY DETECTING DEVICE AND OPERATING METHOD THEREOF

(75) Inventor: Kwan-Wook Jung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 616 days.

(21) Appl. No.: 12/872,520

(22) Filed: Aug. 31, 2010

(65) Prior Publication Data

US 2011/0168907 A1 Jul. 14, 2011

(30) Foreign Application Priority Data

Jan. 14, 2010 (KR) .................... 10-2010-0003516

(51) Int. Cl.
*H01L 27/146* (2006.01)
(52) U.S. Cl.
USPC ..................................................... 250/370.09
(58) Field of Classification Search
USPC ..................................................... 250/370.09
See application file for complete search history.

(56) References Cited

U.S. PATENT DOCUMENTS

| | | | | |
|---|---|---|---|---|
| 5,081,664 | A * | 1/1992 | Lie et al. ..................... | 378/207 |
| 7,180,366 | B2 * | 2/2007 | Roos et al. ................... | 330/86 |
| 7,561,196 | B2 | 7/2009 | Petrick et al. | |
| 8,040,270 | B2 * | 10/2011 | Rao et al. ..................... | 341/172 |
| 8,159,286 | B2 * | 4/2012 | Rao et al. ..................... | 327/554 |
| 2009/0224163 | A1 * | 9/2009 | Endo et al. ............... | 250/370.09 |

FOREIGN PATENT DOCUMENTS

| | | |
|---|---|---|
| JP | 08168482 | 7/1996 |
| JP | 2000262516 | 9/2000 |
| KR | 10-2006-0098453 A | 9/2006 |
| KR | 10-2009-0102185 A | 9/2009 |

* cited by examiner

*Primary Examiner* — Christine Sung

(74) *Attorney, Agent, or Firm* — Robert E. Bushnell, Esq.

(57) ABSTRACT

An X-ray detecting device includes: an X-ray receiving panel including a plurality of scan lines, a plurality of data lines, and a plurality of photodetecting pixels connected to the scan lines and the data lines; a scan driver, connected to the scan lines, for applying a scan signal for controlling outputs of data signals of the photodetecting pixels; and a data detector, connected to the data lines, for receiving the data signals output by the photodetecting pixels, reading the data signals, and controlling capacitance according to transmissivity of a subject. Detective quantum efficiency of the X-ray detecting device can be improved by adaptively controlling capacitance of an integrator according to measured transmissivity of a subject.

14 Claims, 3 Drawing Sheets

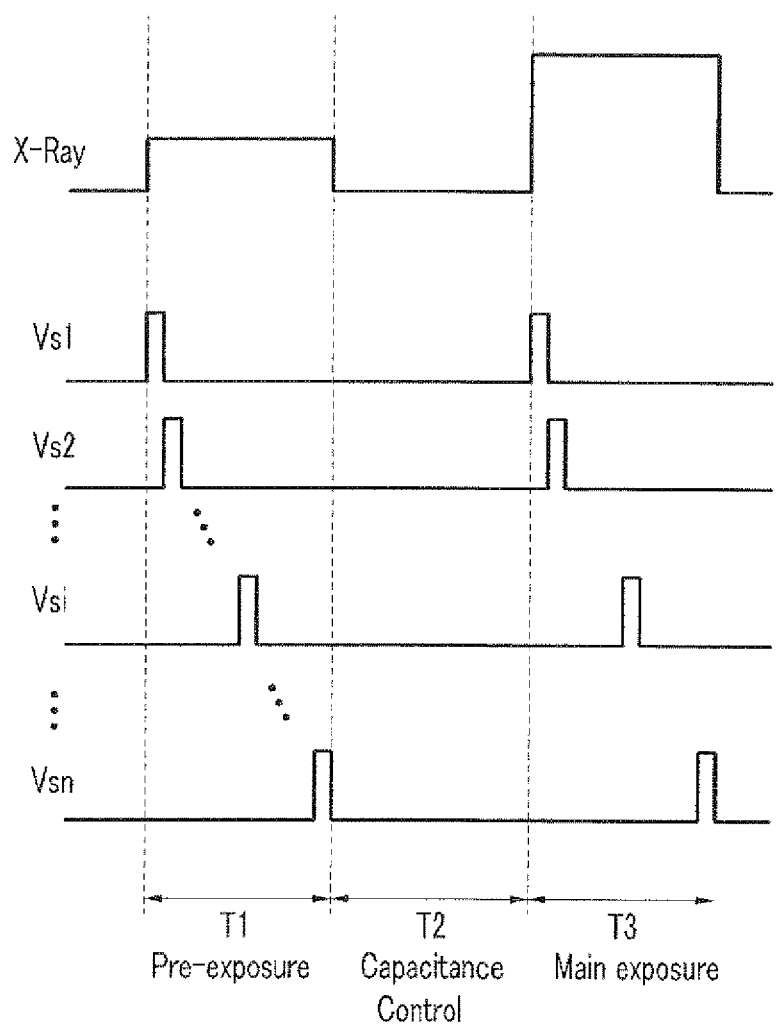

X-RAY DETECTING DEVICE AND OPERATING METHOD THEREOF

CLAIM OF PRIORITY

This application makes reference to, incorporates the same herein, and claims all benefits accruing under 35 U.S.C. §119 from an application earlier filed in the Korean Intellectual Property Office on 14 Jan. 2010 and there duly assigned Serial No. 10-2010-0003516.

BACKGROUND OF THE INVENTION

1. Field of the Invention

The present invention relates to an X-ray detecting device and a driving method thereof. More particularly, the present invention relates to an X-ray detecting device for increasing detection efficiency by controlling capacitance of an integrator according to transmissivity of a subject, and a driving method thereof.

2. Description of the Related Art

An X-ray detecting device detects an X-ray image of a subject taken by an X-ray generating device and provides the image to a display device. An X-ray detecting device of the flat panel type using digital radiography using no film has been generally used. The flat panel X-ray detecting device includes a plurality of photodetecting pixels for detecting the X-rays on the flat panel. Each photodetecting pixel detects the X-rays generated by the X-ray generating device and outputs electrical signals. The electrical signals are read out from the flat panel by a readout integrating circuit (ROIC) for respective rows. The signals output by the readout integrated circuit are processed to be converted into video signals to be transmitted to the display device for displaying the X-ray image.

Performance of the X-ray detecting device is expressed by the detective quantum efficiency (DQE), and when increasing the detective quantum efficiency of the X-ray detecting device, it is a good method for the X-ray generating device to irradiate X-rays with high intensity of radiation or minimize a load of a data line on the flat panel and increase photosensitivity of a PIN diode. A method for increasing the detective quantum efficiency of the X-ray detecting device is proposed as the automatic exposure control (AEC) method. The AEC method represents a load condition control method for the X-ray generating device to automatically control the intensity of radiation irradiated on predetermined various subjects.

Also, the detective quantum efficiency of the X-ray detecting device is influenced by a performance gain of a readout integrated circuit (ROIC) for reading out the electrical signals. Generally, the readout integrated circuit includes a feedback capacitor having constant electric capacity considering entire transmissivity of the subject. For example, when an X-ray image of a person is taken, transmissivity is variable by the body shape and parts of which the image is taken. In consideration of this point, the conventional X-ray detecting device uses a feedback capacitor having constant electrical capacity that is applicable irrespective of the targets of which the image is to be taken.

It takes 1 to 2 seconds for the conventional X-ray detecting device to detect the subject's X-ray image and read it. However, an X-ray detecting device for detecting and reading a taken image at a high speed is required, and the existing device using a feedback capacitor with constant electrical capacity is inappropriate for high-speed operation.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an X-ray detecting device for increasing detective quantum efficiency by controlling a feedback capacitor according to transmissivity of a subject, and a driving method thereof.

An exemplary embodiment of the present invention provides an X-ray detecting device including: an X-ray receiving panel including a plurality of scan lines, a plurality of data lines, and a plurality of photodetecting pixels connected to the scan lines and the data lines; a scan driver, connected to the scan lines, for applying a scan signal for controlling outputs of data signals of the photodetecting pixels; and a data detector, connected to the data lines, for receiving the data signals output by the photodetecting pixels, reading the data signals, and controlling capacitance according to transmissivity of a subject.

The data detector includes a plurality of readout units, connected to the data lines, for receiving current of the photodetecting pixels transmitted through the respective data lines and generating a digital data signal.

The respective readout units include: an integrator, connected to the corresponding data line, for generating an output voltage by integrating the transmitted data signal; and an analog-to-digital converter for converting the output voltage into a digital data signal.

The integrator includes: a differential amplifier including a first input terminal connected to the corresponding data line, a second input terminal for receiving a reference voltage, and an output terminal for outputting the output voltage; a plurality of feedback capacitors coupled in parallel between the first input terminal of the differential amplifier and the output terminal thereof; and a plurality of switches for selectively connecting a corresponding feedback capacitor from among the feedback capacitors to the first input terminal and the output terminal of the differential amplifier.

The respective switches include a first end connected to the first input terminal of the differential amplifier and a second end connected to a first end of the corresponding feedback capacitor from among the feedback capacitors, and a second end of the corresponding feedback capacitor is connected to the output terminal of the differential amplifier.

The switches include: a plurality of feedback switches respectively connected to the feedback capacitors; and a reset switch for resetting the feedback capacitors.

Turn on/off states of the feedback switches are predetermined in a pre-exposure interval in which a predetermined irradiation amount of X-rays for measuring transmissivity of the subject are irradiated.

The reset switch is turned on to reset the feedback switches in a capacitance control interval for controlling capacitance following transmissivity of the subject after the pre-exposure interval.

Turn on/off states of the feedback switches are controlled according to transmissivity of the subject in a capacitance control interval after the pre-exposure interval.

The data detector outputs a main output signal for displaying an X-ray image of the subject in a main exposure interval in which a predetermined irradiation amount of X-rays for displaying the X-ray image of the subject are irradiated after the capacitance control interval.

Another embodiment of the present invention provides a photodetecting device including: a photodetecting pixel; a differential amplifier for amplifying a data signal generated by the photodetecting pixel; a plurality of feedback capacitors coupled in parallel to the differential amplifier; and a plurality of switches for selectively connecting the feedback capacitors to the differential amplifier.

The switches include: a plurality of feedback switches connected to the feedback capacitors; and a reset switch for resetting the feedback capacitors.

Yet another embodiment of the present invention provides a method for driving an X-ray detecting device including an integrator for amplifying a data signal output by a photodetecting pixel, including: generating a pre-output signal by converting a data signal that is output by the photodetecting pixel by a predetermined irradiation amount of X-rays for measuring transmissivity of a subject into a digital signal, thereby performing pre-exposure; calculating transmissivity of the subject from the pre output signal, and controlling capacitance of the integrator according to the calculated transmissivity of the subject, thereby controlling capacitance; and generating a main output signal by converting a data signal that is output by the photodetecting pixel by a predetermined irradiation amount of X-rays for displaying an X-ray image of the subject into a digital signal, thereby performing main exposure.

The pre-exposure includes generating the pre-output signal by predefining an applicable feedback capacitor from among a plurality of feedback capacitors included in the integrator.

According to an embodiment of the present invention, detective quantum efficiency of the X-ray detecting device can be improved by adaptively controlling capacitance of an integrator according to transmissivity of a measured subject. By controlling capacitance of the integrator, there is no need to use the automatic exposure control method, no errors occur according to subject position, and the X-ray irradiation amount can be optimized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3 shows a timing diagram for describing a drive of an X-ray detecting device shown in FIG. 1.

DETAILED DESCRIPTION OF THE INVENTION

Figure 1:
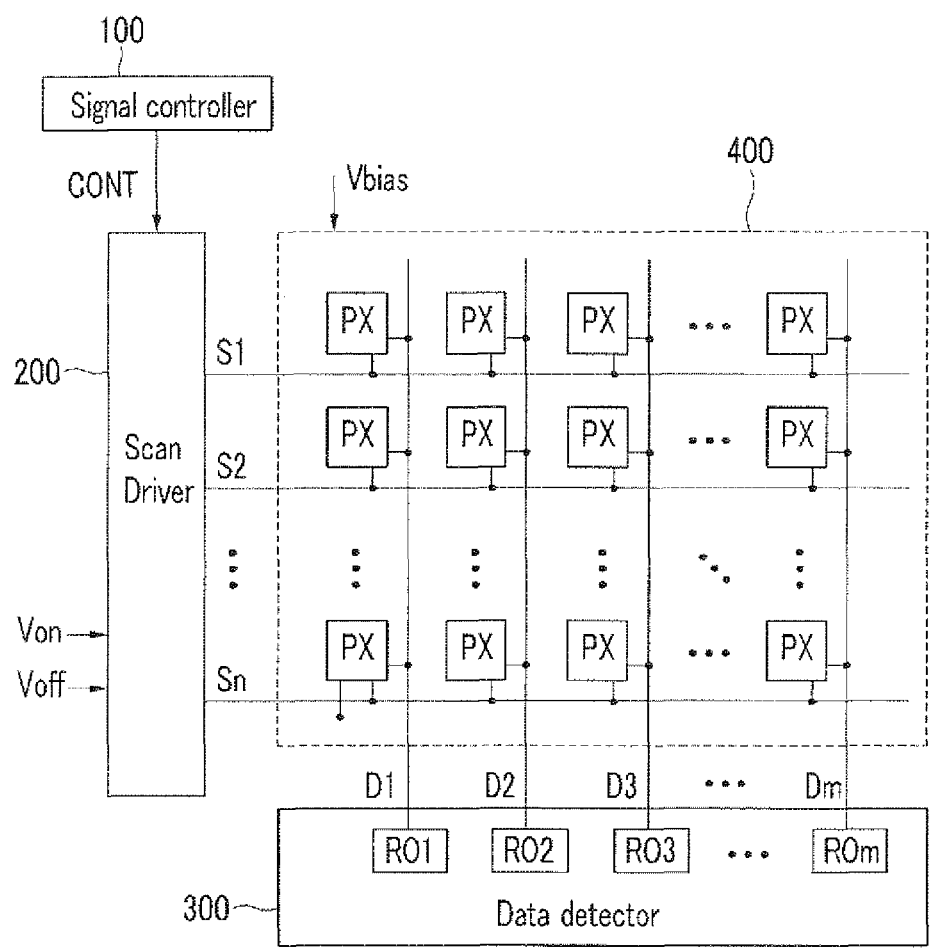
FIG. 1 shows a block diagram of an X-ray detecting device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a block diagram of an X-ray detecting device according to an exemplary embodiment of the present invention.

Referring to FIG. 1, the X-ray detecting device includes a signal controller 100, a scan driver 200, a data detector 300, and an X-ray receiving panel 400.

The X-ray receiving panel 400 includes a plurality of scan lines S1-Sn, a plurality of data lines D1-Dm, and a plurality of photodetecting pixels PX. The photodetecting pixels PX are connected to the signal lines S1-Sn and D1-Dm and are arranged in a matrix form. The scan lines S1-Sn are extended in the row direction and are parallel with each other, and the data lines D1-Dm are extended in the column direction and are parallel with each other. A bias voltage (Vbias) for operating the photodetecting pixels PX is supplied to the X-ray receiving panel 400.

A scintillator film (not shown) for converting the X-rays into visible rays is provided on a surface on which the X-rays are applied by the X-ray receiving panel 400. The scintillator film is made of gadolinium oxysulfide (GOS).

The signal controller 100 generates a scan driving signal (CONT) corresponding to a signal provided by an external device. The scan driving signal (CONT) controls the scan driver 200. The signal controller 100 provides the generated scan driving signal (CONT) to the scan driver 200.

The scan driver 200 is connected to the scan lines S1-Sn of the X-ray receiving panel 400, and it generates a plurality of scan signals that are generated by combining a gate on voltage (Von) for turning on a switching transistor (M1 of FIG. 2) according to the scan driving signal (CONT) and a gate off voltage (Voff) for turning off the same and applies them to the scan lines S1-Sn. The scan signal controls outputs of data signal from the X-ray receiving panel 400.

The data detector 300 includes readout units RO1-ROm connected to the data lines D1-Dm of the X-ray receiving panel 400, and the respective readout units RO1-ROm receive current from the photodetecting pixels PX of the X-ray receiving panel 400 through the respective data lines D1-Dm and read the current to generate digital data signals. The data detector 300 can select electric capacity of a feedback capacitor (Cfb) that is appropriate for the subject's transmissivity.

The above-described driving devices 100, 200, and 300 can be directly installed as integrated circuit chips on the X-ray receiving panel 400, can be installed on a flexible printed circuit film (not shown), can be adhered as a tape carrier package (TCP) to the X-ray receiving panel 400, or can be installed on an additional printed circuit board (not shown). Further, the driving devices 100, 200, and 300 can be integrated on the X-ray receiving panel 400 together with the signal lines S1-Sn and D1-Dm.

Figure 2:
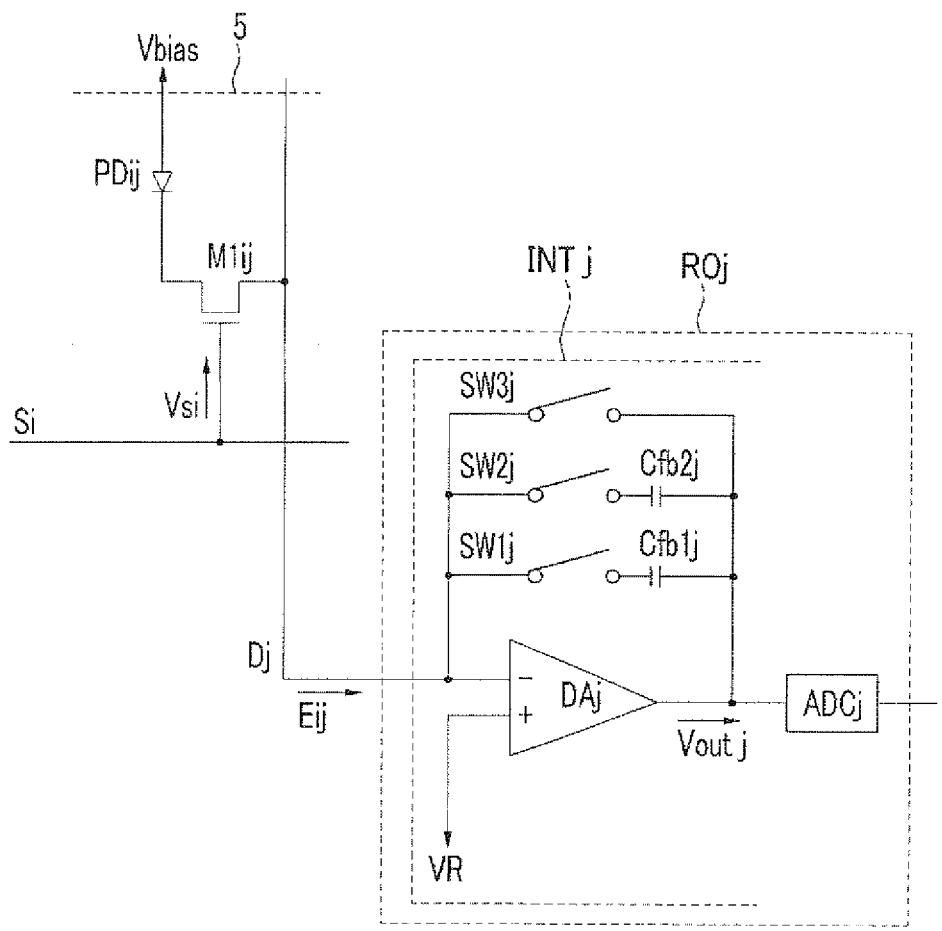
FIG. 2 shows a circuit diagram of one of photodetecting pixels shown in FIG. 1.

FIG. 2 shows a circuit diagram of one of photodetecting pixels and a readout unit shown in FIG. 1.

Referring to FIG. 2, the photodetecting pixel PX of the X-ray detecting device includes a photodiode (PD) and a switching transistor M1, and each of the readout units RO1-ROm includes an integrator INT including a differential amplifier (DA), a feedback capacitor (Cfb), and a switch (SW), and an analog-to-digital converter (ADC).

FIG. 2 shows, from among a plurality of pixels (PX), a photodetecting pixel 5 connected to the i-th scan line (Si) and the j-th data line (Dj), and a readout unit (ROj) connected to the j-th data line (Dj). A configuration and an operation of the photodetecting pixel 5 and the corresponding readout unit (ROj) are similarly applicable to the photodetecting pixels and the corresponding readout units disposed on other rows and columns.

The photodetecting pixel 5 includes a photodiode (PDij) for generating current corresponding to the visible ray applied through a scintillator film, and a switching transistor (M1ij) for transmitting the current (Eij) generated by the photodiode (PDij) to the data line (Dj).

The photodiode (PDij) includes an anode for receiving a bias voltage (Vbias) and a cathode connected to a first electrode of the switching transistor (M1ij). The photodiode (PDij) generates current corresponding to the visible rays applied through the scintillator film. A hydrogenated amorphous silicon (a-Si:H) PIN diode can be used for the photodiode (PD).

The switching transistor (M1ij) includes a gate electrode connected to the scan line (Si), a first electrode connected to the cathode of the photodiode (PDij), and a second electrode connected to the data line (Dj). The switching transistor (M1ij) transmits the current (Eij) flowing from the photodiode (PDij) to the data line (Dj). The switching transistor (M1ij) is turned on when the scan signal (Vsi) of the gate on voltage (Von) is applied from the scan line (Si). When the switching transistor (M1ij) is turned on, the current (Eij) flowing from the photodiode (PDij) is transmitted to the readout unit (ROj) through the data line (Dj). The current (Eij) generated by the photodiode (PDij) and transmitted to the readout unit (ROj) is called a data signal.

The readout unit (ROj) includes a differential amplifier (DAj) connected to the data line (Dj), a plurality of feedback capacitors (Cfb1j and Cfb2j) coupled in parallel to the differential amplifier (DAj), a plurality of switches (SW1j, SW2j, and SW3j) for selectively connecting the feedback capacitors (Cfb1j and Cfb2j) to the differential amplifier (DAj), and an analog-to-digital converter (ADCj) for converting an output voltage (Voutj) output by the differential amplifier (DAj) into a digital signal. The respective feedback capacitors (Cfb1j and Cfb2j) include a first end connected to an inverting terminal (−) of the differential amplifier (DAj) via switches (SW1j and SW2j) and a second end connected to an output terminal of the differential amplifier (DAj). Capacitance of the feedback capacitors (Cfb1j and Cfb2j) can be the same or different.

A plurality of switches (SW1j, SW2j, and SW3j) are divided as feedback switches (SW1j and SW2j) for controlling connection to the differential amplifier (DAj) by the feedback capacitors (Cfb1j and Cfb2j) and a reset switch (SW3j) for resetting the feedback capacitors (Cfb1j and Cfb2j).

The first feedback switch (SW1j) connects the first feedback capacitor (Cfb1j) between the inverting terminal (−) of the differential amplifier (DAj) and the output terminal or floats the same, and the second feedback switch (SW2j) connects the second feedback capacitor (Cfb2j) between the inverting terminal (−) of the differential amplifier and the output terminal or floats the same. Here, two feedback capacitors (Cfb1j and Cfb2j) and two feedback switches (SW1j and SW2j) have been exemplified, and the number of the feedback capacitors and the feedback switches is not restricted thereto.

The feedback switches (SW1j and SW2j) are disposed between the first ends of the corresponding feedback capacitors (Cfb1j and Cfb2j) and the inverting terminal (−) of the differential amplifier (DAj), and they include first ends connected to the first ends of the feedback capacitors (Cfb1j and Cfb2j) and second ends connected to the inverting terminal (−) of the differential amplifier (DAj). In another case, the feedback switches (SW1j and SW2j) are disposed between the second ends of the corresponding feedback capacitors (Cfb1j and Cfb2j) and the output terminal of the differential amplifier (DAj), and they can include first ends connected to the second ends of the feedback capacitors (Cfb1j and Cfb2j) and second ends connected to the output terminal of the differential amplifier (DAj).

The reset switch (SW3j) includes a first end connected to the inverting terminal (−) of the differential amplifier (DAj) and a second end connected to the output terminal. The reset switch (SW3j) includes a first end connected to the output terminal of the differential amplifier (DAj) and a second end connected to the inverting terminal (−) of the differential amplifier (DAj).

The differential amplifier (DAj) includes an inverting terminal (−) connected to the data line (Dj), anon-inverting terminal (+) connected a reference voltage (VR) for amplifying the output signal, and an output terminal connected to the analog-to-digital converter (ADCj). The differential amplifier (DAj) and the feedback capacitors (Cfb1j and Cfb2j) connected between the inverting terminal (−) and the output terminal of the differential amplifier (DAj) form an integrator (INTj). The integrator (INTj) integrates the current (Eij) provided by the photodiode (PDij) to generate an output voltage (Voutj).

The current (Eij) of the photodiode (PDij) transmitted through the data line (Dj) is transmitted to the integrator (INTj) through the turned-on switching transistor (M1ij). Since the transfer function of the integrator (INTj) is inversely proportional to capacitance of the integrator (INTj), capacitance of the integrator (INTj) is increased to reduce the transfer function as the number of the feedback capacitors connected between the inverting terminal (−) and the output terminal is increased, and the capacitance of the integrator is reduced to increase the transfer function as the number of the feedback capacitors is reduced. As an absolute value of the transfer function is increased, the ratio between the input current (current (Eij) provided by the photodiode (PDij)) and the output voltage (Voutj) is big, and hence, a gain of the integrator (INTj) is increased. On the contrary, as the absolute value of the transfer function is reduced, the ratio between the input current (Eij) and the output voltage (Voutj) is small, and hence, the gain of the integrator (INTj) is reduced.

Therefore, when transmissivity is less, capacitance of the integrator (INTj) must be reduced in order to increase sensitivity of the X-ray detecting device. That is, the number of feedback capacitors connected between the inverting terminal (−) and the output terminal is reduced.

In the exemplary embodiment of the present invention, the switches (SW1j and SW2j) are connected to the first ends of the two feedback capacitors (Cfb1j and Cfb2j) to control the number of feedback capacitors connected between the input terminal and the output terminal of the integrator (INTj). However, the present invention is not restricted to the shown configuration and the number of the feedback capacitors included in the integrator and their connection states are changeable, and a configuration for controlling the integrator's capacitance is applicable to the present invention.

The analog-to-digital converter (ADCj) is connected to the output terminal of the integrator (INTj), and it converts the analog output voltage (Voutj) output by the integrator (INTj) into a digital signal.

The above-described configuration of the readout unit (ROj) is not limited to the X-ray detecting device, and it is applicable to the photo-detecting device for processing the data signal generated by the photodetecting pixel PX. The photodetecting device can control capacitance of the integrator (INTj) and increase photodetection efficiency by controlling the turn on/off states of a plurality of switches (SW1j, SW2j, and SW3j).

Referring to FIGS. 1 to 3, a method for driving an X-ray detecting device according to an exemplary embodiment of the present invention will now be described. FIG. 3 shows a timing diagram for describing a drive of an X-ray detecting device shown in FIG. 1.

Referring to FIGS. 1 to 3, the X-rays output by the X-ray generating device (not shown) are passed through a subject to reach the X-ray detecting device. In this instance, the X-rays are converted into the visible rays through the scintillator film, and the visible rays are applied to the photodiode (PD) of the photodetecting pixel (PX) of the X-ray detecting device. The photodiode (PD) generates a current corresponding to the applied visible rays, and the generated current is transmitted to the readout units (RO1-ROm) connected to the data lines D1-Dm.

The signal controller 100 generates a scan driving signal (CONT) satisfying an operational condition of the scan driver 200 according to a signal input by an external device. The scan driving signal (CONT) is transmitted to the scan driver 200. For example, when the X-ray generating device starts irradiating the X-rays, an X-ray irradiation start signal can be transmitted to the signal controller 100, and the signal controller 100 can generate a scan driving signal (CONT) when the X-ray irradiation start signal is input.

The scan driver 200 can sequentially apply a scan signal (Vs) to a plurality of scan lines S1-Sn according to the scan driving signal (CONT).

As shown in FIG. 3, the X-ray generating device performs pre-exposure and main exposure so as to display the X-ray image of the subject. An interval during which pre-exposure is performed is called a pre-exposure interval T1, and an interval during which main exposure is performed is called a main exposure interval T3. The X-ray irradiation amount in the pre-exposure interval T1 is substantially 1/100 of the X-ray irradiation amount in the main exposure interval T3, and a predetermined irradiation amount of X-rays are irradiated. The X-ray detecting device measures a pre-output signal that is output for pre-exposure to calculate the subject's transmissivity, and applies a suitable feedback capacitor to the subject's transmissivity. The time for the X-ray detecting device to calculate transmissivity of the subject for pre-exposure and control the feedback capacitor is referred to as a capacitance control interval T2.

In the pre-exposure interval T1, the X-ray generating device irradiates a predetermined irradiation amount of X-rays. The pre-exposed X-rays transmit through the subject and pass through the scintillator film to be converted into the visible rays. The visible rays are applied to a plurality of photodiodes (PD) of the pixels (PX), and the respective photodiodes (PD) generate current according to the amount of irradiation of the visible rays.

The scan driver 200 turns on the switching transistor M1 of each pixel (PX) by sequentially applying the gate on voltage (Von) to the scan lines S1-Sn during the pre-exposure interval T1. When the switching transistor M1 is turned on, the current (E) generated by the photodiode (PD) is transmitted to the readout units (RO1-ROm) through the data lines D1-Dm.

While the first scan signal Vs1 is High during the pre-exposure interval T1, the current flowing to the respective photodiodes (PD) of the pixels (PX) connected to the first scan line S1 is transmitted to the data detector 300 through the corresponding data lines D1-Dm. The data detector 300 includes a plurality of readout units (RO1-ROm), and the respective readout units (RO1-ROm) generate output signals by integrating the current (E) provided by the corresponding data lines D1-Dm.

The data detector 300 stores output signals that are information on the respective currents of the photodiodes (PD) corresponding to the first scan lines S1.

The data detector 300 generates and stores the output signals by integrating the current of a plurality of photodiodes corresponding to the second scan line S2 during the period in which the second scan signal Vs2 is High. This process continues for the duration of pre-exposure interval T1 until all the scan lines (S1-Sn) are sequentially addressed by the gate-on voltage (Von).

Accordingly, information on the X-rays that are received by the X-ray receiving panel 400 during the pre-exposure interval T1 is stored.

During the pre-exposure interval T1, the reset switch SW3 is turned off, and capacitance of the integrator (INT) of a plurality of readout units (RO1-ROm) can be set in a random manner.

In detail, pre-exposure can be performed while the two feedback switches (SW1j and SW2j) of the readout unit (ROD) connected to the data line (Dj) are turned on or one of them is turned off.

Accordingly, a pre-output signal for a plurality of photodetecting pixels (PX) can be detected by sequentially applying the scan signals (Vs1-Vsn) to a plurality of scan lines S1-Sn in the pre-exposure interval T1.

In the capacitance control interval T2, the data detector 300 calculates the subject's transmissivity from the pre-output signal, and determines which of the feedback capacitors (Cfb1j and Cfb2j) to turn on or off according to the subject's transmissivity. During the capacitance control interval T2, the scan signals (Vs1-Vsn) are not generated, so no current occurs at the photodiodes (PD) of the plurality of pixels (PX). The reset switch SW3 is turned on to reset the feedback capacitor corresponding to the feedback switch that is operable in the pre-exposure interval T1.

When the irradiation amount of the X-rays pre-exposed by the X-ray generating device, electrical capacity of the feedback capacitors Cfb1 and Cfb2 of the readout units (RO1-ROm), and turn on/off state of the corresponding switch(es) are predetermined, the data detector 300 can calculate the transmissivity of the subject from the pre-output signal. The data detector 300 turns off the reset switch SW3 corresponding to the subject's transmissivity, and controls capacitance of the integrator (INT) by controlling the turn on/off states of the feedback switches SW1 and SW2. Capacitance of the integrator (INT) can be predefined according to the subject's transmissivity or the pre-output signal, and the data detector 300 operates the feedback capacitors Cf1 and Cf2 by controlling the turn on/off states of the feedback switches SW1 and SW2 according to defined capacitance.

For example, when the first feedback switch SW1 and the second feedback switch SW2 are turned on so that the first feedback capacitor Cf1 and the second feedback capacitor Cf2 may be operable in the pre-exposure interval T1, capacitance of the integrator (INT) is determined according to electrical capacity of the first feedback capacitor Cf1 and the second feedback capacitor Cf2. In this instance, when it is needed to reduce capacitance of the integrator (INT), capacitance of the integrator (INT) can be reduced by turning off at least one of the first feedback switch SW1 and the second feedback switch (SW2j) in the capacitance control interval T2.

The main exposure interval T3 is operable in a like manner of the pre-exposure interval T1. However, the irradiation amount of the X-rays transmitted to the subject by the X-ray generating device in the main exposure interval T3 is different. The X-rays irradiated during the main exposure interval T3 can be irradiated with a predetermined ratio of the irradiation amount compared to the irradiation amount of the X-rays irradiated during the pre-exposure interval T1.

In detail, a plurality of scan signals (Vs1-Vsn) sequentially become high-level pulses to be transmitted to the corresponding scan lines S1-Sn, and the current (E) of the photodiode (PD) is transmitted to the corresponding readout units (RO1-ROm) through the turned on switching transistor M1 according to the transmitted scan signals (Vs1-Vsn). In this instance, capacitance of the integrator (INT) of the readout units (RO1-ROm) is controlled in the capacitance control interval T2.

The output voltage (Vout) of the integrator (INT) is input to the analog-to-digital converter (ADC), and the analog-to-digital converter (ADC) converts the output voltage (Vout) of the integrator (INT) into a digital signal. The digital signal output during the main exposure interval T3 is called a main output signal.

Accordingly, the main output signal for a plurality of photodetecting pixels (PX) can be detected by sequentially applying the scan signals (Vs1-Vsn) to a plurality of scan lines S1-Sn during the main exposure interval T3.

The data detector 300 transmits the main output signal to the display device for displaying the X-ray image.

As described above, detective quantum efficiency of the X-ray detecting device can be improved by using controlled capacitance following measured transmissivity of the subject through pre-exposure.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An X-ray detecting device having a pre-exposure interval followed by a capacitance control interval followed by a main exposure interval, wherein an X-ray irradiation amount in the pre-exposure interval is less than an X-ray irradiation amount in the main exposure interval, the X-ray detecting device comprising:
an X-ray receiving panel including a plurality of scan lines, a plurality of data lines, and a plurality of photodetecting pixels connected to the scan lines and the data lines;
a scan driver, connected to the scan lines, for applying a corresponding scan signal to each of the scan lines for controlling outputs of data signals of the photodetecting pixels when scanning a subject; and
a data detector utilizing an integrator connected to the data lines for receiving, during the pre-exposure interval, the data signals output by the photodetecting pixels and reading the data signals, then, during the capacitance control interval calculating transmissivity of the subject based on the read data signals and controlling capacitance of the integrator according to the calculated transmissivity of the subject, and then, during the main exposure interval, again receiving the data signals output by the photodetecting pixels to generate a main output signal.

2. The X-ray detecting device of claim 1, the data detector comprising a plurality of readout units, each of said readout units having a corresponding said integrator connected to the data lines, for receiving current of the photodetecting pixels transmitted through the respective data lines, each said readout unit generating a digital data signal in response to an output voltage of the integrator.

3. The X-ray detecting device of claim 2, the respective readout units comprising an analog-to-digital converter for converting the output voltage into the digital data signal.

4. The X-ray detecting device of claim 2, the integrator including:
a differential amplifier including a first input terminal connected to the corresponding data line, a second input terminal for receiving a reference voltage, and an output terminal for outputting the output voltage;
a plurality of feedback capacitors connected between the first input terminal and the output terminal of the differential amplifier, each of the feedback capacitors being selectively coupled to the first input terminal of the differential amplifier;
a plurality of feedback switches for selectively coupling corresponding ones of the feedback capacitors from among the feedback capacitors to the first input terminal of the differential amplifier; and
a reset switch disposed between the input and output terminals of the differential amplifier for selectively resetting ones of the feedback capacitors coupled to the input terminal.

5. The X-ray detecting device of claim 4, wherein turn on/off states of the feedback switches are predetermined in the pre-exposure interval in which a first predetermined X-ray irradiation amount for measuring transmissivity of the subject are irradiated.

6. The X-ray detecting device of claim 5, the reset switch being turned on to reset the feedback switches in the capacitance control interval for controlling capacitance following the measuring of transmissivity of the subject after the pre-exposure interval.

7. The X-ray detecting device of claim 6, wherein turn on/off states of the feedback switches are controlled according to the calculated transmissivity of the subject in the capacitance control interval after the pre-exposure interval.

8. The X-ray detecting device of claim 7, the data detector outputting the main output signal for displaying an X-ray image of the subject in the main exposure interval in which a second predetermined X-ray irradiation amount for displaying the X-ray image of the subject are irradiated after the capacitance control interval.

9. The X-ray detecting device of claim 5, the reset switch being turned on to reset the feedback switches following the pre-exposure interval.

10. A photodetecting device comprising:
a photodetecting pixel;
a differential amplifier for amplifying a data signal generated by the photodetecting pixel;
a plurality of feedback switches for selectively connecting a corresponding plurality of feedback capacitors between an output terminal and an input terminal of said the differential amplifier according to a predetermined arrangement in a pre-exposure interval and according to a characteristic of the data signal during a main exposure interval following the pre-exposure interval, the photodetecting pixel being irradiated by a first predetermined X-ray irradiation during the pre-exposure interval and being irradiated by a second predetermined X-ray irradiation, greater that the first predetermined X-ray irradiation, during the main exposure interval; and
a reset switch selectively connected between the output terminal to the input terminal of said differential amplifier, the reset switch resetting ones of the feedback capacitors connected between the output terminal to the input terminal of said differential amplifier.

11. The photodetecting device of claim 10, said characteristic of the data signal being a measured transmissivity of a scanned subject.

12. A method for driving an X-ray detecting device including an integrator for amplifying a data signal output by a photodetecting pixel, comprising:

generating a pre-output signal by converting a data signal that is output by the photodetecting pixel by a first predetermined X-ray irradiation amount for measuring transmissivity of a subject into a digital signal, thereby performing pre-exposure;

calculating transmissivity of the subject from the pre-output signal, and controlling capacitance of the integrator according to the calculated transmissivity of the subject, thereby controlling integration capacitance; and generating a main output signal by converting a data signal that is output by the photodetecting pixel by a second predetermined X-ray irradiation amount, different from the first predetermined X-ray irradiation amount, for converting an X-ray image of the subject into a digital signal for display, thereby performing main exposure.

13. The method of claim 12, wherein the pre-exposure includes generating the pre-output signal by predefining an applicable feedback capacitor from among a plurality of feedback capacitors included in the integrator.

14. The method of claim 12, the first predetermined X-ray irradiation amount being 1/100th of the second predetermined X-ray irradiation amount.

* * * * *